United States Patent [19]
Kearney et al.

[11] Patent Number: 5,572,472
[45] Date of Patent: Nov. 5, 1996

[54] INTEGRATED ZENER-ZAP NONVOLATILE MEMORY CELL WITH PROGRAMMING AND PRETEST CAPABILITY

[75] Inventors: Mark B. Kearney, Kokomo; Dennis M. Koglin, Carmel; Douglas B. Osborn, Kokomo; William P. Whitlock, Cicero, all of Ind.

[73] Assignee: Delco Electronics Corporation, Kokomo, Ind.

[21] Appl. No.: 421,774

[22] Filed: Apr. 14, 1995

[51] Int. Cl.⁶ ..................................................... G11C 29/00
[52] U.S. Cl. ........................... 365/201; 365/105; 365/175; 365/177
[58] Field of Search ................................... 365/201, 105, 365/175, 177; 371/21.1

[56] References Cited

U.S. PATENT DOCUMENTS

| | | | |
|---|---|---|---|
| 4,819,212 | 4/1989 | Nakai et al. | 365/210 X |
| 5,109,257 | 4/1992 | Kondo | 365/201 X |
| 5,224,070 | 6/1993 | Fandrich et al. | 365/201 X |

*Primary Examiner*—David C. Nelms
*Assistant Examiner*—Huan Hoang
*Attorney, Agent, or Firm*—Jimmy L. Funke

[57] ABSTRACT

A "zener-zap" memory cell with pretest capability for testing effects that would be realized from permanently programming the memory cell is provided. The memory cell is addressable and provides a binary signal at an output. The memory cell uses a zener diode as a memory element which is permanently programmed when selectively coupled to a programming voltage which exceeds the reverse breakdown voltage of the zener diode. The memory cell has a test circuit for generating the programmed binary signal at the output of the memory cell prior to permanently programming the zener diode and when coupled to a pretest voltage.

14 Claims, 2 Drawing Sheets

INTEGRATED ZENER-ZAP NONVOLATILE MEMORY CELL WITH PROGRAMMING AND PRETEST CAPABILITY

BACKGROUND OF THE INVENTION

1. Technical Field

This invention relates generally to integrated memory cells and, more particularly, to a "zener-zap" memory cell with pretest capability for testing effects of the memory cell prior to permanently programming the memory cell by electrically overstressing a memory element.

2. Discussion

Bipolar integrated circuits commonly employ electrically overstressed reversed biased P\N+ junctions operated in the avalanche region as a means for providing nonvolatile memory. This type of programming commonly employs permanently overstressed zener diodes as memory elements and is generally referred to as "zener-zap" programming. Typically, "zener-zap" memory cells include zener diodes as memory elements and are employed in a memory array for providing a plurality of memory bits. In order to program each of the zener diodes, a programming voltage which exceeds the reverse breakdown voltage of the zener diodes is coupled to each memory cell via separate interconnections for electrically overstressing each zener diode. Therefore, if the number of bits to be programmed is large, a similarly large number of interconnections are typically required. Because "zener-zap" programming is irreversible, these interconnections become of no further value once the respective zener diodes are programmed.

Thus, it would be desirable to reduce the number of interconnections required for programming individual "zener-zap" memory cells within a memory array. Furthermore, due to the irreversibility of "zener-zap" programming, it would be desirable to provide a "zener-zap" memory cell with the capability of generating a programmed output signal without irreversibly electrically overstressing the memory cell's zener diode. Such a capability would provide flexibly for testing the effects that permanently programming the memory cell would have on a circuit receiving the programmed output signal.

One of the objects of the present invention is to provide a "zener-zap" memory cell and method that advantageously allows the effects of programming the memory cell to be non-destructively tested prior to permanently programming the memory cell.

Another object of this invention is to provide a "zener-zap" memory array and method that allows a plurality of "zener-zap" memory cells to be individually non-destructively tested and individually permanently programmed with a minimum number of interconnections.

SUMMARY OF THE INVENTION

In accordance with the teachings of the present invention, a programmable "zener-zap" memory cell is provided with pretest capability for non-destructively testing an output of the memory cell prior to permanently programming the memory cell through the application of a programming voltage. A voltage supply provides a pretest voltage and the programming voltage to the memory cell for testing and programming the memory cell. The memory cell includes a memory element for storing binary information. The memory element is permanently programmed when coupled to the programming voltage so as to provide a programmed binary signal at the output of the memory cell. A test circuit is provided for generating the programmed binary signal at the output of the memory cell prior to permanently programming the memory element and when coupled to the pretest voltage. In accordance with a preferred embodiment, an input circuit is provided which is responsive to address signals for selectively coupling the voltage supply to the memory element when properly addressed.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
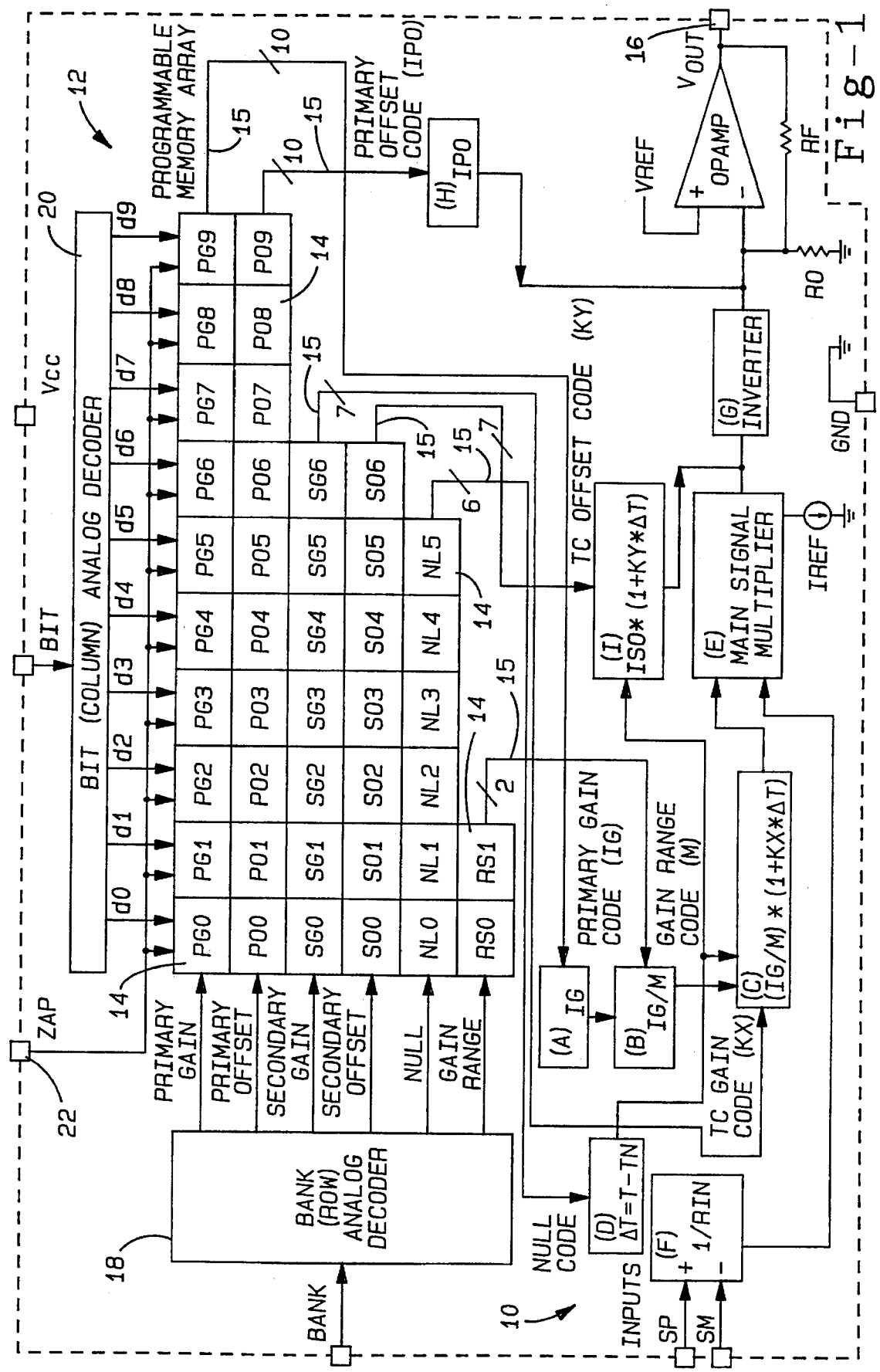
FIG. 1 is a block diagram of a piezoresistive transducer amplifier and conditioning circuitry which is interconnected to the individual outputs of "zener-zap" memory cells employed in an electronically programmable memory array.

Turning now to FIG. 1, a piezoresistive transducer amplifier circuit 10 is shown interconnected to an electronically programmable memory array 12 which employs "zener-zap" memory cells 14. Each of the memory cells 14 has an output that is coupled to the amplifier circuit 10 via lines 15. Each of the lines 15, while illustrated as a single line, represents a plurality of lines that are coupled to each of the respective memory cells 14 in a given row of the memory array 12. According to the example shown, the transducer amplifier circuit 10 receives differential outputs SP and SM from a piezoresistive transducer (not shown). Piezoresistive transducer outputs are typically very small and therefore require amplification. The transducer amplifier circuit 10 circuit 10 receives binary bit signals from each of the memory cells 14 and amplifies the transducer outputs SP and SM and provides a compensated calibrated single-ended output voltage $V_{OUT}$ on output line 16.

The transducer amplifier circuit 10 is adapted to be used in a vehicle (not shown), such as an automobile. More particularly, this invention will be described for use in conditioning signals from a piezoresistive pressure transducer or a motion/accelerometer transducer or other similar sensing device. However, it is to be understood that the use of this invention is not restricted to automobiles, amplifiers, transducers or sensors, but could have other uses in other applications requiring nonvolatile memory.

According to the application shown in FIG. 1, each of the memory cells 14 in the electronically programmable memory array 12 are individually addressable via row decoder 18 and column decoder 20. Each of the memory cells 14 receives row and column address signals from the decoders 18 and 20. The row and column address decoding may be achieved in a manner similar to that provided in co-filed Application Ser. No. D.E. No. H-188716 titled "Analog Voltage Address Decoder Circuit". When properly addressed, the memory cells 14 can be individually tested and/or programmed so as to provide binary outputs for adjusting initial characteristics, such as gain, offset, and temperature compensation, of the transducer amplifier circuit 10. In order to minimize the number of interconnections required for individually testing and/or programming the memory cells 14, each of the memory cells 14 has a common connection to a zap voltage line 22. The zap voltage line 22 is coupled to a voltage supply which provides varying voltage levels.

Figure 2:
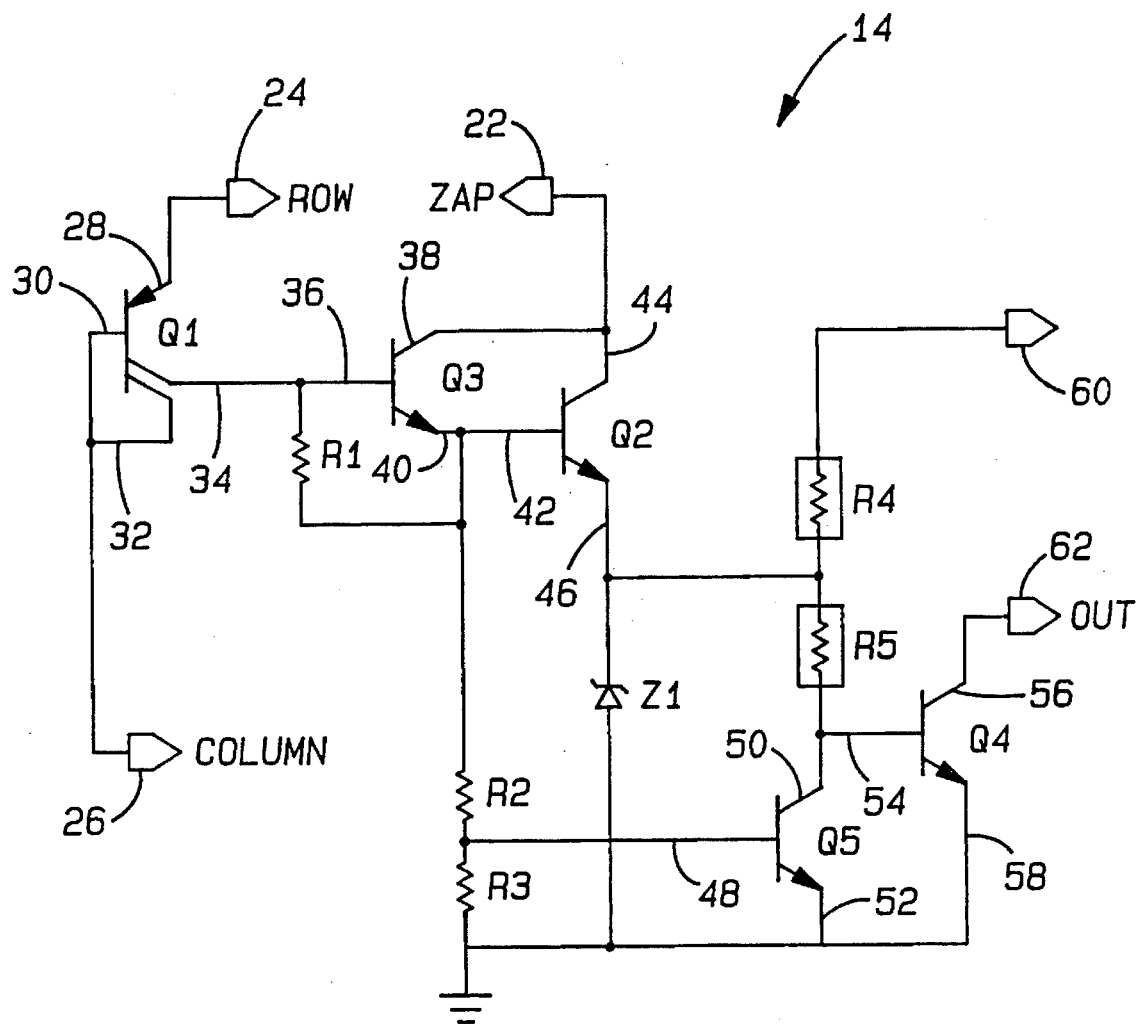
FIG. 2 is a circuit diagram of a "zener-zap" memory cell in accordance with the present invention.

With particular reference to FIG. 2, an individual "zener-zap" memory cell 14 is shown having connections to the zap voltage line 22, a row address line 24, and a column address line 26. Column decoders 18 and 20 generate address voltages that are coupled to memory cell 14 via row and column address lines 24 and 26. As illustrated in FIG. 1, the zap voltage line 22 is also commonly connected to the other memory cells 14 within the memory array 12. As will be apparent from the discussion below, such a common zap voltage reduces the number of interconnections required for testing and programming the memory cells 14 within the memory array 12.

Memory cell 14 includes transistors Q1, Q2, Q3, Q4, and Q5. Transistor Q1 is preferably a PNP configured bipolar transistor, and transistors Q2–Q5 are preferably NPN configured bipolar transistors. Transistor Q1 has an emitter 28, a base 30, a first collector 32, and a second collector 34. Row address line 24 is coupled to the emitter 28 of transistor Q1, and column address line 26 is coupled to both the base 30 and the collector 32 of transistor Q1. Transistor Q3 has a base 36, which is coupled to the collector 34 of transistor Q1, a collector 38, and an emitter 40. The collector 38 of transistor Q3 is coupled to the zap voltage line 22. Resistor R1 is coupled between the base 36 and the emitter 40 of transistor Q3. The emitter 40 of transistor Q3 is coupled to ground (GND) by resistors R2 and R3. Resistors R1, R2 and R3 each preferably have resistances of 25K ohms. Transistor Q2 has a base 42, which is coupled to the emitter 40 of transistor Q3, a collector 44, and an emitter 46. The collector 44 of transistor Q2 is connected to the zap voltage line 22. The emitter 46 of transistor Q2 is connected to the cathode of zener diode Z1 which, in turn, is coupled to ground (GND).

Transistor Q5 of memory cell 14 has a base 48, which is coupled between resistors R2 and R3, a collector 50, and an emitter 52. Transistor Q4 has a base 54, a collector 56, and an emitter 58. The collector 50 of transistor Q5 and the base 54 of Q4 are commonly coupled to a direct current (DC) voltage supply 60 through resistors R4 and R5. The emitter 52 of transistor Q5 and the emitter 58 of transistor Q4 are both coupled to ground. Direct current voltage supply 60 preferably supplies a bias voltage of 2.5 volts. As with the zap voltage line 22, voltage supply 60 is commonly connected to all of the memory cells 14 within memory array 12. Additionally, the emitter of transistor Q2 is coupled to voltage supply 60 through resistor R4. Resistor R4 preferably has a resistance of 150K ohms, and Resistor R5 preferably has a resistance of 25K ohms. The memory cell output line 62 is coupled to the collector 56 of transistor Q4. As will be discussed more fully below, transistor Q4 reads the status of zener diode Z1, and provides an output response at output line 62 that is dependent on the status of zener diode Z1.

In operation, the "zener-zap" memory cell 14 is addressed when a "high" signal is applied to row address line 24 and a "low" signal is applied to column address line 26. The "high" signal is preferably a +5 volt supply, and the "low" signal is a voltage for extracting a sufficiently large current from the column address line 26 for driving the base 36 of transistor Q3. This causes transistor Q1 to "turn on" such that current is conducted through the collector 34 for driving the base 36 of transistor Q3. Once the memory cell 14 has been properly addressed, the zener diode Z1 can be permanently programmed through the application of a programming voltage to zener diode Z1 such that a programmed binary signal is generated at the output line 62, or the memory cell 14 can be tested without permanently programming zener diode Z1 so as to generate the same programmed binary signal at the output line 62. In either situation, the programmed binary signal is supplied to amplifier circuit 10 via lines 15 for digital calibrating purposes. Thus, the effects that testing and/or programming zener diode Z1 have on output voltage $V_{OUT}$ may be monitored at output line 16.

Next, the method of programming the zener diode Z1 will be discussed in detail in accordance with a preferred embodiment of the invention. Assuming that the memory cell 14 has been properly addressed via row and column address lines 24 and 26, the zener diode Z1 is permanently programmed when it is coupled to a programming voltage that is several volts higher than the reverse breakdown voltage of the zener diode Z1. This programming voltage, preferably set at a +25 volt level, is applied to zap voltage line 22 and row address line 24.

When transistor Q1 is properly addressed, the current conducted through the collector 34 of transistor Q1 drives the base 36 of transistor Q3, causing transistor Q3 to "turn on" such that current is conducted through the emitter 40. The current conducted through the emitter 40 of transistor Q3 drives the base 42 of transistor Q2, causing transistor Q2 to "turn on" such that current is conducted through the emitter 46. With transistor Q2 "turned on" the programming voltage, which has been applied to the zap line 22, is coupled by transistor Q2 to zener diode Z1 such that zener diode Z1 is electrically overstressed and operating in the avalanche region. The coupling of the programming voltage to zener diode Z1 and resulting current programs zener diode Z1 such that it functions as a low impedance shunt to ground for the current provided from voltage supply 60 through resistor R4. This results in the base 54 of transistor Q4 being held "low", keeping transistor Q4 "turned off" such that current is not conducted through transistor Q4. As will be apparent to one skilled in the art, this causes transistor Q4 to operate as an open circuit and provide a programmed binary output for the circuitry coupled to the output line 62. In accordance with the application shown in FIG. 1, this programmed binary output is applied to amplifier circuit 10 for purposes of digitally calibrating the amplifier circuit 10 which, in turn, effects the output voltage $V_{OUT}$.

Next, the pretest capability of the memory cell 14 will be discussed in accordance with a preferred embodiment of the invention. Again, assuming that the memory cell 14 has been properly addressed via row and column address lines 24 and 26, the resulting output that would be realized from permanently programming zener diode Z1 may be non-destructively tested prior to actually programming zener diode Z1 by the programming method discussed above. This pretest capability is accomplished by applying a pretest voltage that is at an intermediate potential level which is preferably greater than zero but less than the reverse breakdown voltage of zener diode Z1 to the zap line 22. The programming voltage is preferably set at a +5 volt level.

As discussed in detail above in conjunction with the programming of the zener diode Z1, the current conducted through collector 34 of transistor Q1 drives the base 36 of transistor Q3, causing transistor Q3 to "turn on". Current from the emitter 40 of the transistor Q3 drives the base 42 of transistor Q2, causing transistor Q2 to "turn on". Again, transistor Q2 couples the voltage applied to the zap voltage line 22 to the zener diode Z1. However, when the lower voltage level pretest voltage is applied to the zap voltage line 22, the current conducted by transistor Q2 is blocked by zener diode Z1 because the reverse breakdown voltage of the zener diode Z1 is not exceeded. Therefore, the current conducted from the zap voltage line 22 flows through the emitter 46 of transistor Q2 to the resistor R5. As will be apparent, the current conducted through collector 34 of transistor Q1 is coupled to the base 48 of transistor Q5 through resistor R1 and resistor R2, causing transistor Q5 to "turn on". Thus, the current flowing through resistor R5 is coupled to ground by transistor Q5. Because transistor Q5 has been "turned on", the base 54 of transistor Q4 is held "low", keeping transistor Q4 "turned off" such that transistor Q4 does not conduct current. As a result, transistor Q4 operates as an open circuit and provides the same programmed binary output at output line 62 as if zener diode Z1 had been previously programmed. This pretest capability enables the memory cell 14 to be tested such that the programmed binary output is reflected at output line 62 prior to permanently programming zener diode Z1. Therefore, the resulting output voltage $V_{OUT}$ that would be realized by programming memory cell 14 can be monitored prior to permanently programming zener diode Z1.

The programming and pretest methods discussed in connection with memory cell 14 may be subsequently repeated in order to test and selectively program other memory cells within memory array 12. By selectively testing particular memory cells within memory array 12, the effects that would be realized from programming the particular memory cells may be monitored through the changes in the output voltage $V_{OUT}$ at output line 16 of amplifier circuit 10. Therefore, the individual memory cells 14 are tested and then permanently programmed so as to provide a desired voltage at output line 16.

After memory cell 14 has been tested and/or programmed in accordance with the methods set forth above, transistor Q4 reads the status of zener diode Z1, and provides a binary signal at the output line 62 that is dependent on the status of zener diode Z1. During this post-testing and programming phase, a "low" voltage which is at a level close to ground potential is applied to zap voltage line 22. Therefore, if the zener diode Z1 has not been previously programmed by the application of the programming voltage to zener diode Z1, current supplied by voltage supply 60 through resistors R4 and R5 will drive the base 54 of transistor Q4, causing transistor Q4 to "turn on". As will be apparent to one skilled in the art, transistor Q4 will then operate as a short circuit to ground and provides a binary output reflecting the same for any circuitry coupled to the output line 62. On the other hand, if zener diode Z1 has been programmed by the application of the programming voltage to zener diode Z1, current supplied by voltage supply 60 through resistor R4 will be coupled to ground by zener diode Z1 which functions as a low impedance shunt to ground. Therefore, the base 54 of transistor Q4 will be held "low" and transistor Q4 will operate as an open circuit. In accordance with the application shown in FIG. 1, the binary output read by transistor Q4 is coupled to amplifier circuit 10 for digital calibrating purposes.

While this invention has been disclosed in connection with a particular example thereof, no limitation is intended thereby except as defined in the following claims. This is because a skilled practitioner recognizes that other modifications can be made without departing from the spirit of this invention after studying the specification and drawings.

What is claimed is:

1. An electronic memory circuit cell with pretest capability for testing an output of said memory cell prior to permanently programming said memory cell, comprising:

memory element means for storing binary information, said memory element means being permanently programmed when coupled to a programming voltage so as to provide a programmed binary signal at said output, said memory element means including a zener diode coupled to ground that is permanently overstressed when coupled to said programming voltage and functions as a low impedance shunt to ground;

voltage supply means operable for producing a pretest voltage and said programming voltage; and test circuit means for producing said programmed binary signal at said output prior to permanently programming said memory element means and when coupled to said pretest voltage.

2. The electronic memory circuit cell of claim 1 further comprising:

input circuit means responsive to address signals for selectively coupling said voltage supply means to said memory element means.

3. The electronic memory circuit cell of claim 1 wherein said zener diode is not permanently overstressed when coupled to said pretest voltage, whereby said zener diode does not couple said pretest voltage to ground.

4. The electronic memory circuit cell of claim 3 wherein said programming voltage is at a level greater than the reverse breakdown voltage of said zener diode and wherein said pretest voltage is at a level less than the reverse breakdown voltage of said zener diode.

5. An electronic memory circuit array, comprising:

a plurality of memory cells, each of said memory cells having pretest capability for testing an output of each respective memory cell prior to permanently programming said respective memory cell;

voltage supply means coupled to each of said memory cells in said array for providing a pretest voltage and a programming voltage to each of said memory cells;

said memory cells each including:
(a) memory element means for storing binary information, said memory element means being permanently programmed when coupled to said programming voltage so as to provide a programmed binary signal at said output of said respective memory cell;
(b) input circuit means responsive to address signals for selectively coupling said voltage supply means to said memory element means; and
(c) test circuit means for producing said programmed binary signal at said respective output of said respective cell when coupled to said pretest voltage.

6. The electronic memory array of claim 5 wherein each of said memory element means includes a zener diode coupled to ground, and wherein said zener diode is permanently overstressed when coupled to said programming voltage such that said zener diode functions as a low impedance shunt to ground.

7. The electronic memory circuit array of claim 6 wherein said zener diode is not permanently overstressed when coupled to said pretest voltage such that said zener diode does not couple said pretest voltage to ground.

8. The electronic memory circuit cell of claim 7 wherein said programming voltage is at a level greater than the reverse breakdown voltage of said zener diode and wherein said pretest voltage is at a level less than the reverse breakdown voltage of said zener diode.

9. An electronic memory circuit cell with pretest capability for testing an output of said memory cell prior to permanently programming said memory cell, said output of said memory cell being coupled to an amplifier for calibrating said amplifier, said memory cell comprising:

zener diode memory element for storing binary information, said zener diode memory element being permanently programmed when coupled to a programming voltage so as to provide a programmed binary signal at said output;

voltage supply means operable for producing said pretest voltage and said programming voltage; and test circuit means for producing said programmed binary signal at said output of said memory cell when coupled to said pretest voltage, wherein said output couples said programmed binary signal to said amplifier prior to permanently programming said zener diode memory element for testing the calibration of said amplifier.

10. The electronic memory circuit cell of claim 9 further comprising:

input circuit means responsive to address signals for selectively coupling said voltage supply means to said zener diode memory element.

11. A method for programming an electronic memory circuit cell including a zener diode memory element and a test circuit means, comprising the steps of:

supplying a pretest voltage to said memory cell such that said test circuit means provides a programmed binary signal at an output of said memory cell;

monitoring effects of providing said programmed binary signal at said output of said memory cell to determine if said effects are sufficient; and supplying a programming voltage to said zener diode memory element for permanently programming said zener diode memory element so as to provide said programmed binary signal at said output of said cell if said effects monitored are desired.

12. The method of claim 11 further comprising the step of:

receiving address signals on an input circuit means for addressing said memory cell.

13. A method for programming an electronic memory circuit array including a plurality of memory cells, comprising the steps of:

addressing a first memory cell of said plurality of memory cells;

supplying a pretest voltage to said plurality of memory cells such that a first test circuit means of said first memory cell provides a first programmed binary signal at a first output of said first memory cell;

monitoring effects of providing said first programmed binary signal at said first output of said first memory cell to determine if said effects are sufficient;

supplying a programming voltage to said plurality of memory cells for permanently programming a first memory element of said first memory cell so as to provide said first programmed binary signal at said first output of said first memory cell if said effects monitored are desired;

addressing a second memory cell of said plurality of memory cells;

supplying said pretest voltage to said plurality of memory cells such that a second test circuit means of said second memory cell provides a second programmed binary signal at a second output of said second memory cell;

monitoring the effects of providing said second programmed binary signal at said second output of said second memory cell to determine if said effects are sufficient; and supplying said programming voltage to said plurality of memory cells for permanently programming a second memory element of said second memory cell so as to provide said second programmed binary signal at said second output of said second memory cell if said effects monitored are desired.

14. A method for programming an electronic memory circuit array including a plurality of memory cells with outputs coupled to an amplifier for digitally calibrating said amplifier, comprising the steps of:

addressing a first memory cell of said plurality of memory cells;

supplying a pretest voltage to said plurality of memory cells such that a first test circuit means of said first memory cell provides a first programmed binary signal at a first output of said first memory cell;

monitoring an output signal of said amplifier to determine if said first programmed binary signal has a desired effect on said output signal of said amplifier;

supplying a programming voltage to said plurality of memory cells for permanently programming a first memory element of said first memory cell so as to provide said first programmed binary signal at said first output of said first memory cell if said effects on said output signal of said amplifier are desired;

addressing a second memory cell of said plurality of memory cells;

supplying said pretest voltage to said plurality of memory cells such that a second test circuit means of said second memory cell provides a second programmed binary signal at a second output of said second memory cell;

monitoring said output signal of said amplifier to determine if said second programmed binary signal has a desired effect on said output signal of said amplifier; and supplying said programming voltage to said plurality of memory cells for permanently programming a second memory element of said second memory cell so as to provide said second programmed binary signal at said second output of said second memory cell if said effects on said output signal of said amplifier are desired.

\* \* \* \* \*